(12) United States Patent
Wang

(10) Patent No.: US 10,685,084 B2
(45) Date of Patent: Jun. 16, 2020

(54) DEVICE AND METHOD FOR MANAGING RISK IN AREA

(71) Applicant: HONGFUJIN PRECISION ELECTRONICS (TIANJIN) CO., LTD., Tianjin (CN)

(72) Inventor: Shih-Cheng Wang, New Taipei (TW)

(73) Assignee: HONGFUJIN PRECISION ELECTRONICS (TIANJN) CO., LTD., Tianjin (CN)

( * ) Notice: Subject to any disclaimer, the term of this patent is extended or adjusted under 35 U.S.C. 154(b) by 297 days.

(21) Appl. No.: 15/846,231

(22) Filed: Dec. 19, 2017

(65) Prior Publication Data

US 2019/0155869 A1    May 23, 2019

(30) Foreign Application Priority Data

Nov. 20, 2017   (CN) .......................... 2017 1 1160799

(51) Int. Cl.
| | |
|---|---|
| *G06F 17/18* | (2006.01) |
| *G06Q 10/00* | (2012.01) |
| *G06Q 10/06* | (2012.01) |
| *G06F 30/00* | (2020.01) |

(52) U.S. Cl.
CPC .............. *G06F 17/18* (2013.01); *G06F 30/00* (2020.01); *G06Q 10/0635* (2013.01); *G06Q 10/20* (2013.01)

(58) Field of Classification Search
CPC .... G06Q 10/0635; G06Q 10/20; G06F 17/18; G06F 17/50
See application file for complete search history.

(56) References Cited

U.S. PATENT DOCUMENTS

2009/0138306 A1* 5/2009 Coburn .................. G06Q 10/00
                                                      705/7.28

* cited by examiner

*Primary Examiner* — Bryan Bui
(74) *Attorney, Agent, or Firm* — ScienBiziP, P.C.

(57) ABSTRACT

A risk managing device for monitoring and managing one or more areas at risk, includes an obtaining module, a setting module, an updating module, a calculating module, and a sorting module. The obtaining module obtains live inspection information of an area. The setting module sets a Severity, Occurrence, and Detection (SOD) score for each failure factor of each safety device. The updating module updates the SOD score of each failure factor of each safety device according to the live inspection information. The calculating module calculates a grey correlation degree of each safety device according to updated SOD score. The sorting module outputs a risk sorting list of the plurality of safety devices of the area according to the grey correlation degree of each safety device. A risk managing method is also provided.

16 Claims, 6 Drawing Sheets

DEVICE AND METHOD FOR MANAGING RISK IN AREA

FIELD

The subject matter herein generally relates to devices and methods for managing area risk.

BACKGROUND

A current risk evaluation method can detect multiple risk factors of a monitored area. But the current risk evaluation method cannot generate a processing sequence of the multiple risk factors to manage the monitored area in response to the monitored area having a risk warning.

BRIEF DESCRIPTION OF THE DRAWINGS

Implementations of the present technology will now be described, by way of example only, with reference to the attached figures.

DETAILED DESCRIPTION

Figure 1:
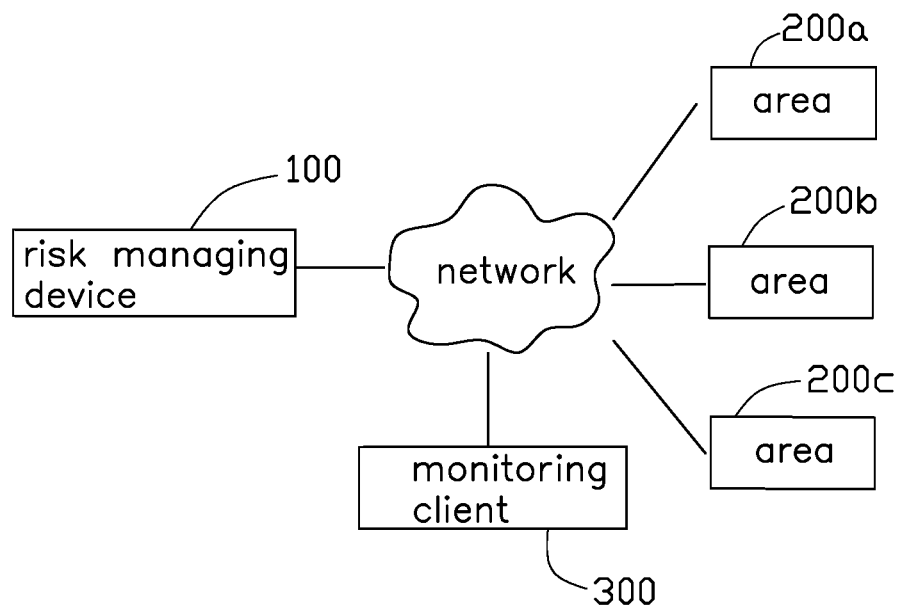
FIG. 1 is an operating environment diagram of an embodiment of a risk managing device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The term "comprising," when utilized, means "including, but not necessarily limited to"; it specifically indicates open-ended inclusion or membership in the so-described combination, group, series, and the like.

FIG. 1 illustrates a risk managing device 100 in accordance with an embodiment.

The risk managing device 100 monitors a plurality of areas and obtains risk information of the plurality of areas through accessing a network. The plurality of areas in this embodiment can comprise three areas 200a, 200b, and 200c. The risk information can be a fire risk, a dust risk, a hazardous material leak risk, and others. The risk managing device 100 can transmit the risk information of areas 200a, 200b, and 200c, to a monitoring client 300 to inform an administrator.

In one embodiment, the monitoring client 300 can be a mobile phone or a computer. The risk managing device 100 can be operated in a cloud server.

Figure 2:
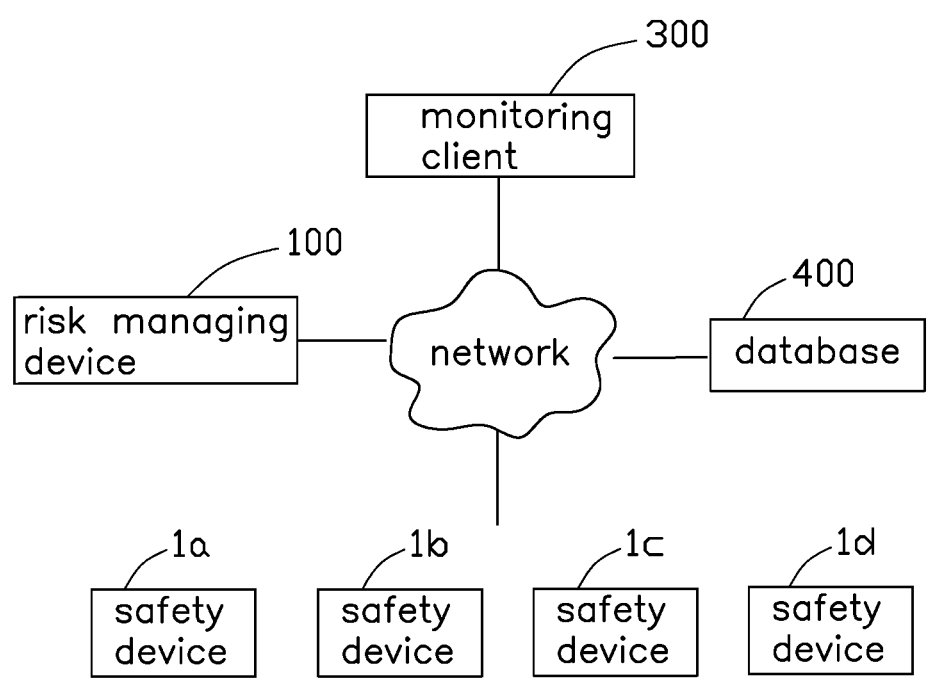
FIG. 2 is an architecture diagram of an embodiment of the risk managing device of FIG. 1.

Referring to FIG. 2, the risk managing device 100 monitors a fire risk of the area 200a for example. The area 200a comprises a plurality of safety devices. The plurality of safety devices can comprise four safety devices, 1a to 1d, for example. The safety devices, 1a to 1d, can include a smoke sensor, a temperature sensor, a carbon monoxide sensor, an alarm button, a spray valve, and a spray pressure switch. A database 400 can store a plurality of parameters relating to the area 200a. The parameters can comprise live inspection information, operating information, maintenance information, and current information of the safety devices, 1a to 1d.

Figure 3:
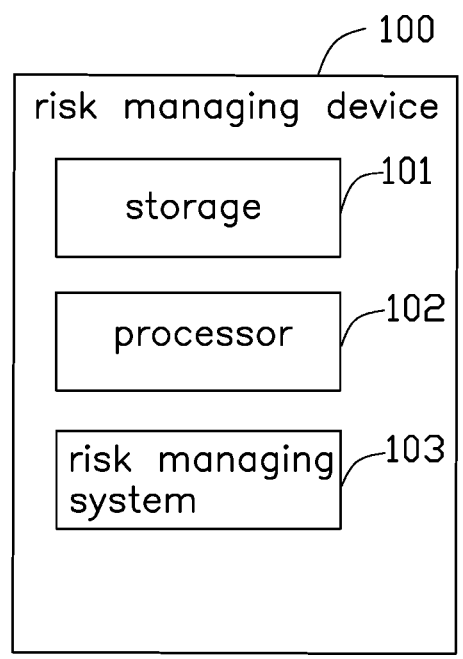
FIG. 3 is a block diagram of an embodiment of the risk managing device of FIG. 1.
Figure 4:
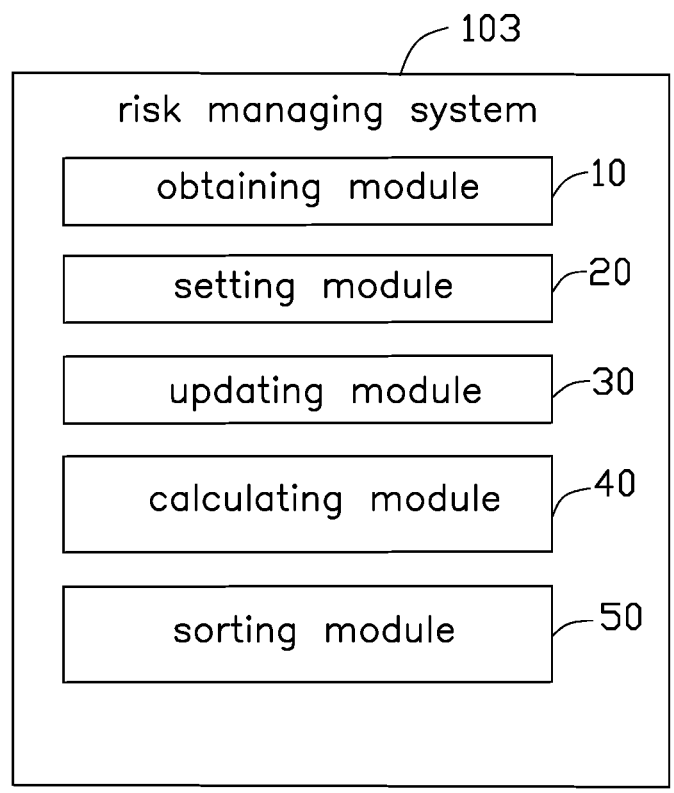
FIG. 4 is a block diagram of an embodiment of a risk managing system of the risk managing device of FIG. 1.

Referring to FIGS. 3 and 4, the risk managing device 100 can comprise at least one storage 101, at least one processor 102, and a risk managing system 103. The risk managing system 103 can further comprises a plurality of modules, such as an obtaining module 10, a setting module 20, an updating module 30, a calculating module 40, and a sorting module 50. The modules, 10 to 50, can comprise one or more software programs in the form of computerized codes stored in the storage 101. The computerized codes can include instructions that can be executed by the processor 102 to provide functions for the modules, 10 to 50. The safety devices, 1a to 1d, include the smoke sensor, the alarm button, the spray valve, and the spray pressure switch for example.

The obtaining module 10 is configured to obtain live inspection information of the plurality of safety devices, 1a to 1d, of the area 200a. Each of the plurality of safety devices, 1a to 1d, can comprise a plurality of failure factors.

In one embodiment, the live inspection information of the plurality of safety devices, 1a to 1d, of the area 200a can be stored in the storage 11 or the database 400. The obtaining module 10 can communicate with the database 400 to obtain the live inspection information of the plurality of safety devices, 1a to 1d, of the area 200a.

In one embodiment, the live inspection information can comprise periodic inspection recorded information, periodic maintenance recorded information, environmental pollution information, equipment damage information, oxidation damage information, audit system executing information, line aging information, line connection information, and switch state information.

The setting module 20 is configured to set an SOD score for each failure factor of each safety device, 1a to 1d. The SOD score represents a risk grade of a risk priority number (RPN). The SOD score comprises a severity (Sev) score, an occurrence (Occ) score, and a detection (Det) score.

In one embodiment, the setting module 20 can set the Sev score, the Occ score, and the Det score for each failure factor of each safety device, 1a to 1d, according to a failure mode and effect analysis (FMEA) scoring rule.

In one embodiment, a first table as below shows a scoring rule of the Sev score and the Det score:

TABLE 1

| Sev | Score | Det | Score |
|---|---|---|---|
| real-time protection can reduce consequences | 3 | Easy to detect | 3 |
| requires observation for a period of time before response protection measures to mitigate consequences | 6 | may detect | 6 |
| difficult to take preventive measures and can cause serious consequences | 9 | difficult to detect | 9 |

A second table as below shows a scoring rule of the Occ score:

TABLE 2

| Occ | Score | Probability of occurrence |
|---|---|---|
| very low | 1 | 0 |
|  | 2 | 1/20000 |
|  | 3 | 1/10000 |
| moderate | 4 | 1/2000 |
|  | 5 | 1/1000 |
|  | 6 | 1/200 |
| high | 7 | 1/100 |
|  | 8 | 1/20 |
| very high | 9 | 1/10 |
|  | 10 | 1/2 |

In one embodiment, the Sev score and the Det score of each failure factor of each safety device, $1a$ to $1d$, can be scored according to the table 1. The Occ score of each failure factor of each safety device, $1a$ to $1d$, is set as an initial score. For example, an initial probability of each failure factor of each safety device, $1a$ to $1d$, is 1/200. According to the table 2, the initial score of the Occ score of each failure factor of each safety device, $1a$ to $1d$, is 6.

A third table as below shows a first RPN sequence of the plurality of safety devices, $1a$ to $1d$, of the area $200a$. In the table 3, the Sev score and the Det score of each failure factor of each safety device, $1a$ to $1d$, can be scored according to the table 1:

TABLE 3

| First RPN sequence | | | | |
|---|---|---|---|---|
| safety device | failure factor | Sev | Occ | Det |
| smoke sensor (1a) | periodic inspection recorded information | 3 | 6 | 3 |
|  | periodic maintenance recorded information | 3 | 6 | 3 |
|  | environmental pollution information | 6 | 6 | 6 |
|  | equipment damage information | 9 | 6 | 9 |
|  | audit system executing information | 3 | 6 | 3 |
| alarm button (1b) | periodic inspection recorded information | 3 | 6 | 3 |
|  | periodic maintenance recorded information | 3 | 6 | 3 |
|  | audit system executing information | 3 | 6 | 3 |
|  | line aging information | 6 | 6 | 9 |
|  | equipment damage information | 9 | 6 | 9 |
| spray valve (1c) | periodic inspection recorded information | 3 | 6 | 3 |
|  | periodic maintenance recorded information | 3 | 6 | 3 |
|  | audit system executing information | 3 | 6 | 3 |
|  | line connection information | 6 | 6 | 9 |
|  | oxidation damage information | 6 | 6 | 9 |
|  | line aging information | 6 | 6 | 9 |
| spray pressure switch (1d) | periodic inspection recorded information | 3 | 6 | 3 |
|  | periodic maintenance recorded information | 3 | 6 | 3 |
|  | audit system executing information | 3 | 6 | 3 |
|  | switch state information | 6 | 6 | 9 |

In the table 3, failure factors of the smoke sensor $1a$ comprise the periodic inspection recorded information, the periodic maintenance recorded information, the environmental pollution information, the equipment damage information, and the audit system executing information. Failure factors of the alarm button $1b$ comprise the periodic inspection recorded information, the periodic maintenance recorded information, the audit system executing information, the line aging information, and the equipment damage information. Failure factors of the spray valve $1c$ comprise the periodic inspection recorded information, the periodic maintenance recorded information, the audit system executing information, the line connection information, the oxidation damage information, and the line aging information. Failure factors of the spray pressure switch $1d$ comprise the periodic inspection recorded information, the periodic maintenance recorded information, the audit system executing information, and the switch state information.

The updating module 30 is configured to update the SOD score of each failure factor of each safety device, $1a$ to $1d$, according to the live inspection information of each safety device, $1a$ to $1d$.

In one embodiment, the updating module 30 updates the initial score of the Occ score of each failure factor of each safety device, $1a$ to $1d$, according to the live inspection information of each safety device, $1a$ to $1d$.

For example, the updating module 30 updates the initial score of the Occ score of the periodic inspection recorded information of the smoke sensor $1a$. A fourth table as below shows a periodic inspection record of the smoke sensor $1a$.

TABLE 4

| Predetermined detection time | Detect or not | Failure interval |
|---|---|---|
| 2017 Jan. 1 | yes | 120 days (T1) |
| 2017 Feb. 1 | yes |  |
| 2017 Mar. 1 | yes |  |
| 2017 Apr. 1 | yes |  |
| 2017 May 1 | no |  |
| 2017 Jun. 1 | yes | 92 days (T2) |
| 2017 Jul. 1 | yes |  |
| 2017 Aug. 1 | no |  |
| 2017 Sep. 1 | yes | 61 days (T3) |
| 2017 Oct. 1 | no |  |
| 2017 Nov. 1 | yes | >31 days (T4) |
| 2017 Dec. 1 | null | null |

In the table 4, the "null" represents detection time not yet determinable. The updating module 30 can calculate a failure rate $Ø1$ of the periodic inspection recorded information Post probability density function of the smoke sensor $1a$ through a Bayesian analytic algorithm. For example, a prior probability density function of the failure rate $Ø1$ is a gamma distribution, a prior expected value a1 is $5*10^{-3}$ time/day, and a coefficient of variation is 200%. A gamma distribution probability density function is $f(Ø) \propto Ø^{k-1} \exp$ ($\emptyset/\theta$), where k represents a shape parameter and $\theta$ represents a scale parameter. A post probability density function of the failure rate $\emptyset 1$ is $f(\emptyset|T1, T2, T3, T4) \propto f(T1, T2, T3, T4|\emptyset)*f(\emptyset)$. The updating module 30 can calculate k=3.25, $\theta$=0.002824 time/day, and a probability density expected value a2=k*$\theta$=3.25*0.002824 time/day=1/109 time/day. According to the table 2, the probability density expected value a2 is between a first probability of occurrence (1/200) and a second probability of occurrence (1/100). The updating module 30 updates from 6 to 7 the initial score of the Occ score of the periodic inspection recorded information of the smoke sensor 1a. The updating module 30 updates the first RPN sequence of the table 3 to obtain an updated first RPN sequence of the plurality of safety devices, 1a to 1d, of the area 200a.

A fifth table as below shows the updated first RPN sequence of the plurality of safety devices, 1a to 1d, of the area 200a:

TABLE 5

Updated first RPN sequence

| safety device | failure factor | Sev | Occ | Det |
|---|---|---|---|---|
| smoke sensor (1a) | periodic inspection recorded information | 3 | 7 | 3 |
| | periodic maintenance recorded information | 3 | 6 | 3 |
| | environmental pollution information | 6 | 6 | 6 |
| | equipment damage information | 9 | 6 | 9 |
| | audit system executing information | 3 | 6 | 3 |
| alarm button (1b) | periodic inspection recorded information | 3 | 6 | 3 |
| | periodic maintenance recorded information | 3 | 6 | 3 |
| | audit system executing information | 3 | 6 | 3 |
| | line aging information | 6 | 6 | 9 |
| | equipment damage information | 9 | 6 | 9 |
| spray valve (1c) | periodic inspection recorded information | 3 | 6 | 3 |
| | periodic maintenance recorded information | 3 | 6 | 3 |
| | audit system executing information | 3 | 6 | 3 |
| | line connection information | 6 | 6 | 9 |
| | oxidation damage information | 6 | 6 | 9 |
| | line aging information | 6 | 6 | 9 |
| spray pressure switch (1d) | periodic inspection recorded information | 3 | 6 | 3 |
| | periodic maintenance recorded information | 3 | 6 | 3 |
| | audit system executing information | 3 | 6 | 3 |
| | switch state information | 6 | 6 | 9 |

The calculating module 40 is configured to calculate a grey correlation degree of each safety device, 1a to 1d, according to updated SOD score.

In one embodiment, the calculating module 40 calculates a difference value between the updated SOD score and an SOD score of a reference sequence and calculate a grey relational coefficient of each failure factor of each safety device, 1a to 1d, according to the difference value. The calculating module 40 further calculates the grey correlation degree of each safety device, 1a to 1d, according to the grey relational coefficient of each failure factor of each safety device, 1a to 1d.

In one embodiment, the calculating module 40 can calculate a grey correlation degree of each failure factor of each safety device, 1a to 1d, according to the grey relational coefficient of each failure factor of each safety device, 1a to 1d. The calculating module 40d calculates a mean value of the plurality of failure factors of each safety device, 1a to 1d, to obtain the grey correlation degree of each safety device, 1a to 1d.

In one embodiment, an RPN value of the reference sequence is 1. A sixth table as below shows the reference sequence:

TABLE 6

Reference sequence

| safety device | failure factor | Sev | Occ | Det |
|---|---|---|---|---|
| smoke sensor (1a) | periodic inspection recorded information | 1 | 1 | 1 |
| | periodic maintenance recorded information | 1 | 1 | 1 |
| | environmental pollution information | 1 | 1 | 1 |
| | equipment damage information | 1 | 1 | 1 |
| | audit system executing information | 1 | 1 | 1 |
| alarm button (1b) | periodic inspection recorded information | 1 | 1 | 1 |
| | periodic maintenance recorded information | 1 | 1 | 1 |
| | audit system executing information | 1 | 1 | 1 |
| | line aging information | 1 | 1 | 1 |
| | equipment damage information | 1 | 1 | 1 |
| spray valve (1c) | periodic inspection recorded information | 1 | 1 | 1 |
| | periodic maintenance recorded information | 1 | 1 | 1 |
| | audit system executing information | 1 | 1 | 1 |
| | line connection information | 1 | 1 | 1 |
| | oxidation damage information | 1 | 1 | 1 |
| | line aging information | 1 | 1 | 1 |
| spray pressure switch (1d) | periodic inspection recorded information | 1 | 1 | 1 |
| | periodic maintenance recorded information | 1 | 1 | 1 |
| | audit system executing information | 1 | 1 | 1 |
| | switch state information | 1 | 1 | 1 |

The calculating module 40d calculates a difference value between the SOD score of the table 5 and the SOD score of the table 6 to obtain a difference sequence, and a seventh table as below shows the difference sequence:

TABLE 7

Difference sequence

| safety device | failure factor | Sev | Occ | Det |
|---|---|---|---|---|
| smoke sensor (1a) | periodic inspection recorded information | 2 | 6 | 2 |
| | periodic maintenance recorded information | 2 | 5 | 2 |
| | environmental pollution information | 5 | 5 | 5 |
| | equipment damage information | 8 | 5 | 8 |
| | audit system executing information | 2 | 5 | 2 |
| alarm button (1b) | periodic inspection recorded information | 2 | 5 | 2 |
| | periodic maintenance recorded information | 2 | 5 | 2 |
| | audit system executing information | 2 | 5 | 2 |
| | line aging information | 5 | 5 | 8 |
| | equipment damage information | 8 | 5 | 8 |
| spray valve (1c) | periodic inspection recorded information | 2 | 5 | 2 |
| | periodic maintenance recorded information | 2 | 5 | 2 |
| | audit system executing information | 2 | 5 | 2 |
| | line connection information | 5 | 5 | 8 |
| | oxidation damage information | 5 | 5 | 8 |
| | line aging information | 5 | 5 | 8 |

TABLE 7-continued

| | Difference sequence | | | |
|---|---|---|---|---|
| safety device | failure factor | Sev | Occ | Det |
| spray pressure switch (1d) | periodic inspection recorded information | 2 | 5 | 2 |
| | periodic maintenance recorded information | 2 | 5 | 2 |
| | audit system executing information | 2 | 5 | 2 |
| | switch state information | 5 | 5 | 8 |

The calculating module 40d can calculate the grey relational coefficient of each failure factor of each safety device, 1a to 1d, through the table 7 and a grey relational coefficient formula. The grey relational coefficient formula is shown below:

$$\gamma(x_0(k), x_i(k)) = \frac{\min_i \min_k \Delta_{0i}(k) + \zeta \max_i \max_k \Delta_{0i}(k)}{\Delta_{0i}(k) + \zeta \max_i \max_k \Delta_{0i}(k)}.$$

An eighth table as below shows calculated grey relational coefficient of each failure factor of each safety device, 1a to 1d:

TABLE 8

| | Grey relational coefficient of safety device | | | |
|---|---|---|---|---|
| safety device | failure factor | S | O | D |
| smoke sensor (1a) | periodic inspection recorded information | 1.0000 | 0.6000 | 1.0000 |
| | periodic maintenance recorded information | 1.0000 | 0.6667 | 1.0000 |
| | environmental pollution information | 0.6667 | 0.6667 | 0.6667 |
| | equipment damage information | 0.5000 | 0.6667 | 0.5000 |
| | audit system executing information | 1.0000 | 0.6667 | 1.0000 |
| alarm button (1b) | periodic inspection recorded information | 1.0000 | 0.6667 | 1.0000 |
| | periodic maintenance recorded information | 1.0000 | 0.6667 | 1.0000 |
| | audit system executing information | 1.0000 | 0.6667 | 1.0000 |
| | line aging information | 0.6667 | 0.6667 | 0.5000 |
| | equipment damage information | 0.5000 | 0.6667 | 0.5000 |
| spray valve (1c) | periodic inspection recorded information | 1.0000 | 0.6667 | 1.0000 |
| | periodic maintenance recorded information | 1.0000 | 0.6667 | 1.0000 |
| | audit system executing information | 1.0000 | 0.6667 | 1.0000 |
| | line connection information | 0.6667 | 0.6667 | 0.5000 |
| | oxidation damage information | 0.6667 | 0.6667 | 0.5000 |
| | line aging information | 0.6667 | 0.6667 | 0.5000 |
| spray pressure switch (1d) | periodic inspection recorded information | 1.0000 | 0.6667 | 1.0000 |
| | periodic maintenance recorded information | 1.0000 | 0.6667 | 1.0000 |
| | audit system executing information | 1.0000 | 0.6667 | 1.0000 |
| | switch state information | 0.6667 | 0.6667 | 0.5000 |

The calculating module 40 can calculate the grey correlation degree of each failure factor of each safety device, 1a to 1d, according to the table 8. The grey correlation degree of each failure factor of each safety device, 1a to 1d, is equal to a mean value of SOD grey relational coefficients.

For example, the grey correlation degree of a first failure factor (the periodic inspection recorded information) of the smoke sensor 1a is 0.8667 (i.e., 1+0.6+1)/3=0.8667). The grey correlation degree of a second failure factor (the periodic maintenance recorded information) of the smoke sensor 1a is 0.8889 (i.e., (1+0.6667+1)/3=0.8889). The grey correlation degree of a third failure factor (the environmental pollution information) of the smoke sensor 1a is 0.6667 (i.e., (0.6667+0.6667+0.6667)/3=0.6667). The grey correlation degree of a fourth failure factor (the equipment damage information) of the smoke sensor 1a is 0.5556 (i.e., (0.5+0.6667+0.5)/3=0.5556). The grey correlation degree of a fifth failure factor (the audit system executing information) of the smoke sensor 1a is 0.8889 (i.e., (1+0.6667+1)/3=0.8889). The grey correlation degree of the safety device 1a is 0.7773 (i.e., (0.8667+0.8889+0.6667+0.5556+0.8889)/5=0.7733).

The sorting module 50 is configured to output a risk sorting list of the plurality of safety devices, 1a to 1d, of the area 200a according to the grey correlation degree of each safety device, 1a to 1d.

A ninth table as below shows calculated grey correlation degree of each failure factor and each safety device, 1a to 1d:

TABLE 9

| | Grey correlation degree list of the area | | | |
|---|---|---|---|---|
| safety device | failure factor | grey correlation degree of failure factor | grey correlation degree of safety device | risk sorting |
| smoke sensor (1a) | periodic inspection recorded information | 0.8667 | 0.7733 | 3 |
| | periodic maintenance recorded information | 0.8889 | | |
| | environmental pollution information | 0.6667 | | |
| | equipment damage information | 0.5556 | | |
| | audit system executing information | 0.8889 | | |
| alarm button (1b) | periodic inspection recorded information | 0.8889 | 0.7667 | 2 |
| | periodic maintenance recorded information | 0.8889 | | |
| | audit system executing information | 0.8889 | | |
| | line aging information | 0.6111 | | |
| | equipment damage information | 0.5556 | | |
| spray valve (1c) | periodic inspection recorded information | 0.8889 | 0.7500 | 1 |
| | periodic maintenance recorded information | 0.8889 | | |
| | audit system executing information | 0.8889 | | |
| | line connection information | 0.6111 | | |
| | oxidation damage information | 0.6111 | | |
| | line aging information | 0.6111 | | |
| spray pressure switch (1d) | periodic inspection recorded information | 0.8889 | 0.8194 | 4 |
| | periodic maintenance recorded information | 0.8889 | | |
| | audit system executing information | 0.8889 | | |
| | switch state information | 0.6111 | | |

When a grey correlation degree of a safety device is closer to 1, a failure risk of the safety device is lower. According to the table 9, the safety device 1d has the lowest failure risk among the safety devices, 1a to 1d, and the safety device 1c has the highest failure risk among the safety devices, 1a to 1d. When the area 200a has a risk warning, an administrator can preferentially check the safety device 1c.

In one embodiment, when the area 200a has the risk warning, the administrator can check the safety devices of the area 200a according to the risk sorting of the table 9.

Figure 5:
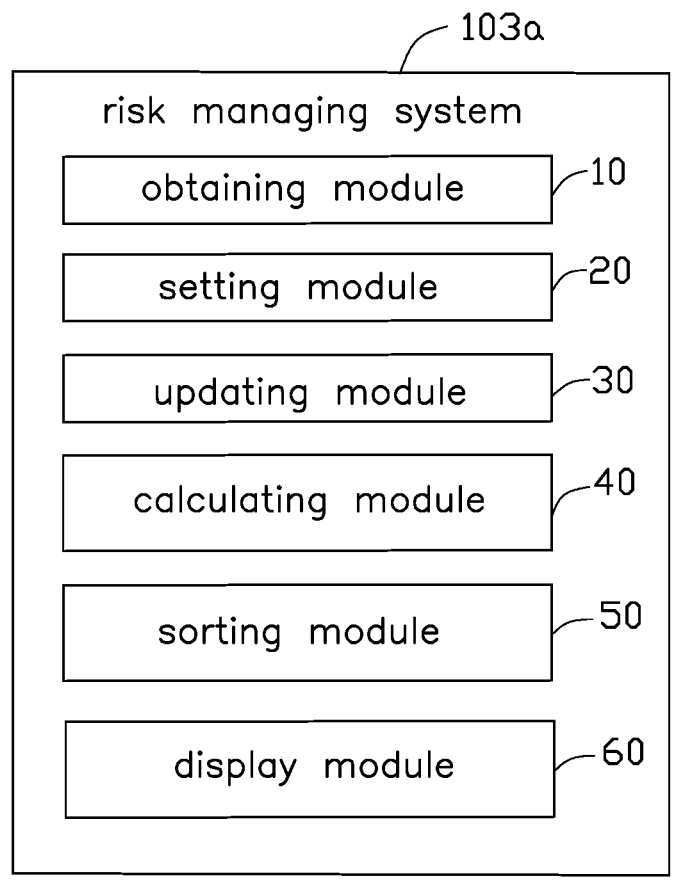
FIG. 5 is a block diagram of another embodiment of the risk managing system of the risk managing device of FIG. 1.

Referring to FIG. 5, a risk managing system 103a comprises the obtaining module 10, the setting module 20, the updating module 30, the calculating module 40, the sorting module 50, and a display module 60. The display module 60 is configured to generate a risk guide map according to the risk sorting list of the safety devices, 1a to 1d, of the area 200a. The display module 60 can further display the safety devices that have higher priorities through different colors.

For example, the display module 60 displays the safety device 1c in red, the safety device 1b in pink, and the safety device 1a in orange.

Figure 6:
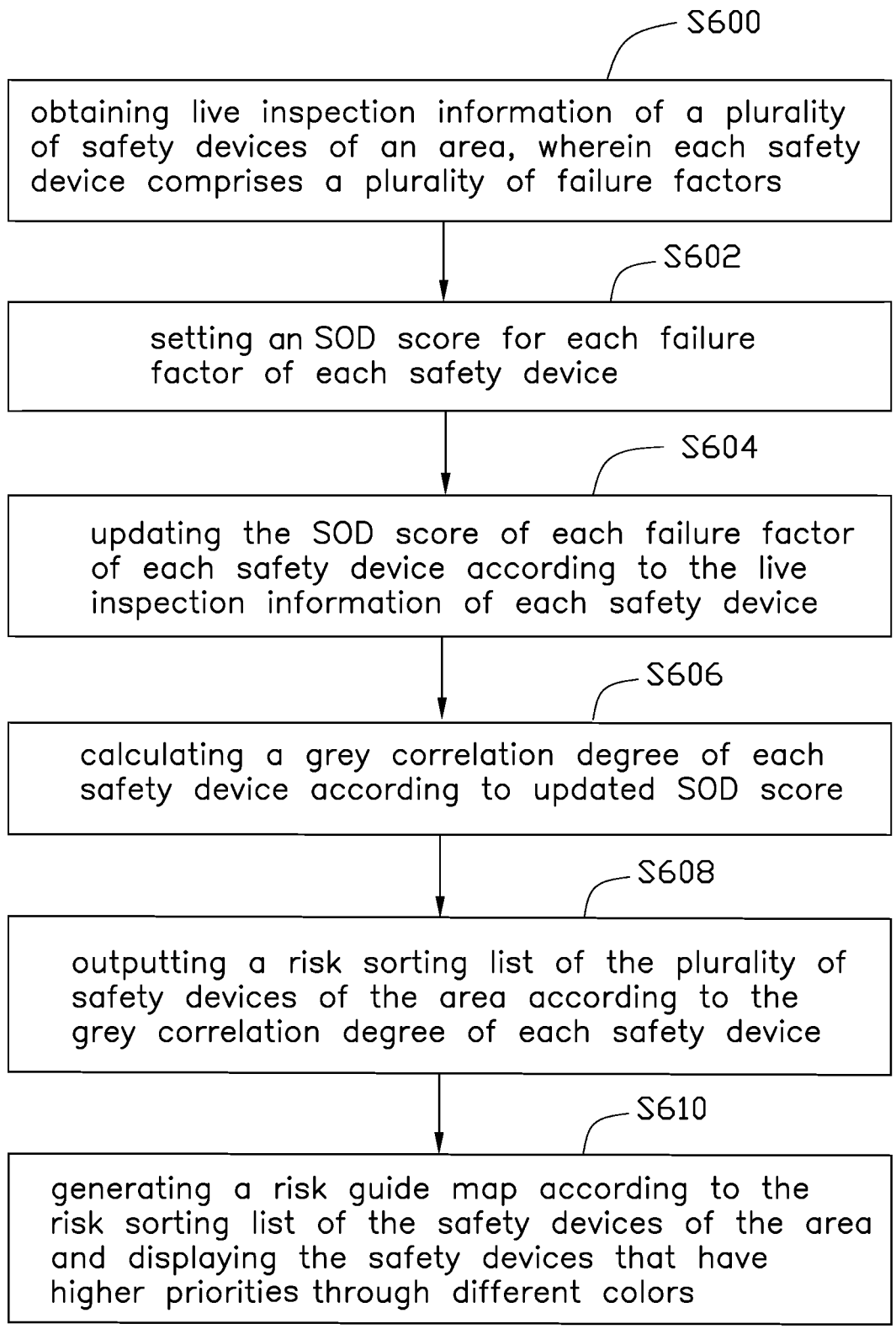
FIG. 6 is a flowchart of an embodiment of a risk managing method.

FIG. 6 illustrates one embodiment of a risk managing method. The flowchart presents an one embodiment of the method. The exemplary method is provided by way of example, as there are a variety of ways to carry out the method. The method described below can be carried out using the configurations illustrated in FIG. 4 or FIG. 5, for example, and various elements of these figures are referenced in explaining the example method. Each step shown in FIG. 6 represents one or more processes, methods, or subroutines, carried out in the example method. Furthermore, the illustrated order of steps is illustrative only and the order of the steps can change. Additional steps can be added or fewer steps may be utilized, without departing from this disclosure. The example method can begin at step 600.

In step 600, the obtaining module 10 obtains live inspection information of the plurality of safety devices, 1a to 1d, of the area 200a.

In step 602, the setting module 20 sets an SOD score for each failure factor of each safety device, 1a to 1d.

In step 604, the updating module 30 updates the SOD score of each failure factor of each safety device, 1a to 1d, according to the live inspection information of each safety device, 1a to 1d.

In step 606, the calculating module 40 calculates a grey correlation degree of each safety device, 1a to 1d, according to updated SOD score.

In step 608, the sorting module 50 outputs a risk sorting list of the plurality of safety devices, 1a to 1d, of the area 200a according to the grey correlation degree of each safety device, 1a to 1d.

In step 610, the display module 60 generates a risk guide map according to the risk sorting list of the safety devices, 1a to 1d, of the area 200a and displays the safety devices that have higher priorities through different colors.

In one embodiment, the live inspection information can comprise periodic inspection recorded information, periodic maintenance recorded information, environmental pollution information, equipment damage information, oxidation damage information, audit system executing information, line aging information, line connection information, and switch state information.

In one embodiment, the SOD score represents a risk grade of a risk priority number (RPN). The SOD score comprises a severity (Sev) score, an occurrence (Occ) score, and a detection (Det) score.

In one embodiment, the setting module 20 can set the Sev score, the Occ score, and the Det score for each failure factor of each safety device, 1a to 1d, according to a failure mode and effect analysis (FMEA) scoring rule.

In one embodiment, the Sev score and the Det score of each failure factor of each safety device, 1a to 1d, can be scored according to the table 1. The Occ score of each failure factor of each safety device, 1a to 1d, is set as an initial score.

In one embodiment, the updating module 30 updates the initial score of the Occ score of each failure factor of each safety device, 1a to 1d, according to the live inspection information of each safety device, 1a to 1d.

In one embodiment, the calculating module 40 calculates a difference value between the updated SOD score and an SOD score of a reference sequence and calculate a grey relational coefficient of each failure factor of each safety device, 1a to 1d, according to the difference value. The calculating module 40 further calculates the grey correlation degree of each safety device, 1a to 1d, according to the grey relational coefficient of each failure factor of each safety device, 1a to 1d.

In one embodiment, the calculating module 40 can calculate a grey correlation degree of each failure factor of each safety device, 1a to 1d, according to the grey relational coefficient of each failure factor of each safety device, 1a to 1d. The calculating module 40d calculates a mean value of the plurality of failure factors of each safety device, 1a to 1d, to obtain the grey correlation degree of each safety device, 1a to 1d.

In one embodiment, the calculating module 40d can calculate the grey relational coefficient of each failure factor of each safety device, 1a to 1d, through the table 7 and a grey relational coefficient formula. The grey relational coefficient formula is shown below:

$$\gamma(x_0(k), x_i(k)) = \frac{\min_i \min_k \Delta_{0i}(k) + \zeta \max_i \max_k \Delta_{0i}(k)}{\Delta_{0i}(k) + \zeta \max_i \max_k \Delta_{0i}(k)}.$$

In one embodiment, when a grey correlation degree of a safety device is closer to 1, a failure risk of the safety device is lower. According to the table 9, the safety device 1d has the lowest failure risk among the safety devices, 1a to 1d, and the safety device 1c has the highest failure risk among the safety devices, 1a to 1d. When the area 200a has a risk warning, an administrator can preferentially check the safety device 1c.

In one embodiment, when the area 200a has the risk warning, the administrator can check the safety devices of the area 200a according to the risk sorting of the table 9.

The embodiments shown and described above are only examples. Many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the one embodiments described above may be modified within the scope of the claims.

What is claimed is:

1. A risk managing device comprising:
at least one processor;
a storage; and
one or more programs that are stored in the storage and executed by the at least one processor, the one or more programs comprising instructions for:
obtaining live inspection information of a plurality of safety devices of an area, wherein each safety device comprises a plurality of failure factors;
setting a severity, occurrence, and detection (SOD) score for each failure factor of each safety device, wherein the SOD score comprises a severity (Sev) score, an occurrence (Occ) score, and a detection (Det) score;
updating the SOD score of each failure factor of each safety device according to the live inspection information of each safety device;
calculating a difference value between the updated SOD score and an SOD score of a reference sequence;
calculating a grey correlation degree of each safety device according to the difference value; and
outputting a risk sorting list of the plurality of safety devices of the area according to the grey correlation degree of each safety device.

2. The risk managing device of claim 1, wherein the instruction of setting the SOD score for each failure factor of each safety device comprises:
setting the Sev score, the Occ score, and the Det score for each failure factor of each safety device according to a failure mode and effect analysis (FMEA) scoring rule.

3. The risk managing device of claim 2, wherein the Sev score and the Det score are scored according to a predetermined scoring rule, the Occ score is set as an initial score according to the FMEA scoring rule.

4. The risk managing device of claim 3, wherein the instruction of updating the SOD score of each failure factor of each safety device according to the live inspection information of each safety device comprises:
updating the initial score of the Occ score of each failure factor of each safety device according to the live inspection information of each safety device.

5. The risk managing device of claim 1, wherein the instruction of calculating the grey correlation degree of each safety device according to the difference value comprises:
calculating a grey relational coefficient of each failure factor of each safety device according to the difference value; and
calculating the grey correlation degree of each safety device according to the grey relational coefficient of each failure factor of each safety device.

6. The risk managing device of claim 5, wherein a risk priority number (RPN) value of the reference sequence is 1.

7. The risk managing device of claim 5, wherein the instruction of calculating the grey correlation degree of each safety device according to the grey relational coefficient of each failure factor of each safety device comprises:
calculating a grey correlation degree of each failure factor of each safety device according to the grey relational coefficient of each failure factor of each safety device; and
calculating a mean value of the plurality of failure factors of each safety device to obtain the grey correlation degree of each safety device.

8. The risk managing device of claim 1, wherein the one or more programs further comprise instructions for:
generating a risk guide map according to the risk sorting list of the area; and
displaying the safety devices that have higher priorities through different colors.

9. A risk managing method comprising:
obtaining live inspection information of a plurality of safety devices of an area, wherein each safety device comprises a plurality of failure factors;
setting a severity, occurrence, and detection (SOD) score for each failure factor of each safety device, wherein the SOD score comprises a severity (Sev) score, an occurrence (Occ) score, and a detection (Det) score;
updating the SOD score of each failure factor of each safety device according to the live inspection information of each safety device;
calculating a difference value between the updated SOD score and an SOD score of a reference sequence;
calculating a grey correlation degree of each safety device according to the difference value; and
outputting a risk sorting list of the plurality of safety devices of the area according to the grey correlation degree of each safety device.

10. The risk managing method of claim 9, wherein the step of setting the SOD score for each failure factor of each safety device comprises:
setting the Sev score, the Occ score, and the Det score for each failure factor of each safety device according to a failure mode and effect analysis (FMEA) scoring rule.

11. The risk managing method of claim 10, wherein the Sev score and the Det score are scored according to a predetermined scoring rule, the Occ score is set as an initial score according to the FMEA scoring rule.

12. The risk managing method of claim 11, wherein the step of updating the SOD score of each failure factor of each safety device according to the live inspection information of each safety device comprises:
updating the initial score of the Occ score of each failure factor of each safety device according to the live inspection information of each safety device.

13. The risk managing method of claim 9, wherein the step of calculating the grey correlation degree of each safety device according to the difference value comprises:
calculating a grey relational coefficient of each failure factor of each safety device according to the difference value; and
calculating the grey correlation degree of each safety device according to the grey relational coefficient of each failure factor of each safety device.

14. The risk managing method of claim 13, wherein a risk priority number (RPN) value of the reference sequence is 1.

15. The risk managing method of claim 13, wherein the step of calculating the grey correlation degree of each safety device according to the grey relational coefficient of each failure factor of each safety device comprises:
calculating a grey correlation degree of each failure factor of each safety device according to the grey relational coefficient of each failure factor of each safety device; and
calculating a mean value of the plurality of failure factors of each safety device to obtain the grey correlation degree of each safety device.

16. The risk managing method of claim 9, further comprising:
generating a risk guide map according to the risk sorting list of the area; and displaying the safety devices that have higher priorities through different colors.

\* \* \* \* \*